US012212324B2

(12) United States Patent
Gambero et al.

(10) Patent No.: US 12,212,324 B2
(45) Date of Patent: Jan. 28, 2025

(54) PROCESS, VOLTAGE, AND TEMPERATURE INVARIANT TIME-TO-DIGITAL CONVERTER WITH SUB-GATE DELAY RESOLUTION

(71) Applicant: STMicroelectronics International N.V., Geneva (CH)

(72) Inventors: Andrea Gambero, Milan (IT); Juri Giovannone, Cernobbio (IT); Roberto Giorgio Bardelli, Como (IT); Alessandro Nicolosi, Dresano (IT)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 43 days.

(21) Appl. No.: 18/330,871

(22) Filed: Jun. 7, 2023

(65) Prior Publication Data

US 2024/0413813 A1  Dec. 12, 2024

(51) Int. Cl.
*H03K 5/01* (2006.01)
*G04F 10/00* (2006.01)
*H03K 5/00* (2006.01)

(52) U.S. Cl.
CPC ............. *H03K 5/01* (2013.01); *G04F 10/005* (2013.01); *H03K 2005/00078* (2013.01)

(58) Field of Classification Search
CPC ............ H03K 5/01; H03K 2005/00078; G04F 10/005
USPC ........................................................ 327/261
See application file for complete search history.

(56) References Cited

U.S. PATENT DOCUMENTS

| 5,969,552 | A | 10/1999 | Lee et al. | |
|---|---|---|---|---|
| 6,100,735 | A * | 8/2000 | Lu | H03L 7/0814 331/25 |
| 6,580,304 | B1 * | 6/2003 | Rieven | H03H 11/26 327/158 |
| 6,774,694 | B1 * | 8/2004 | Stern | H03K 5/133 327/284 |

(Continued)

OTHER PUBLICATIONS

Dehng et al., "Clock-deskew buffer using a SAR-controlled delay-locked loop," in IEEE Journal of Solid-State Circuits, vol. 35, No. 8, pp. 1128-1136, Aug. 2000, doi: 10.1109/4.859501.

(Continued)

*Primary Examiner* — Ryan Jager
(74) *Attorney, Agent, or Firm* — Alston & Bird LLP (57) ABSTRACT

A control circuit and a method for delaying an electronic signal are provided, along with a time-to-digital converter including the control circuit. The example control circuit includes a first delay circuit having a first plurality of delay elements electrically connected in series and configured to generate a first control voltage associated with a first delay time. The control circuit further includes a second delay circuit having a second plurality of delay elements electrically connected at least in part in series. The second delay circuit is configured to generate a second control voltage associated with a second delay time. A first group of delay elements within the second plurality of delay elements exhibits the first delay time based on the first control voltage, and a second group of the second plurality of delay elements exhibits a second delay time based at least in part on the second control voltage.

20 Claims, 8 Drawing Sheets

(56) References Cited

U.S. PATENT DOCUMENTS

| | | | |
|---|---|---|---|
| 6,867,627 B1* | 3/2005 | Murtagh | H03L 7/0816 327/158 |
| 7,019,576 B1 | 3/2006 | Sancheti et al. | |
| 7,026,850 B2* | 4/2006 | Atyunin | H03K 5/135 327/158 |
| 7,057,429 B2* | 6/2006 | Kim | G11C 7/22 327/158 |
| 7,274,238 B2 | 9/2007 | Takahashi et al. | |
| 7,304,516 B2* | 12/2007 | Johnson | H03L 7/0818 327/158 |
| 7,616,036 B1* | 11/2009 | Tabatabaei | G01R 31/318572 327/158 |
| 7,782,104 B2* | 8/2010 | Madoglio | H03L 7/08 327/158 |
| 7,805,628 B2* | 9/2010 | Kushnick | H03L 7/0805 713/503 |
| 7,961,033 B2* | 6/2011 | Meninger | H03L 7/0816 374/170 |
| 8,981,974 B2 | 3/2015 | Chaivipas et al. | |
| 2003/0099321 A1* | 5/2003 | Juan | H03L 7/16 375/376 |
| 2014/0159805 A1 | 6/2014 | Zhu et al. | |

OTHER PUBLICATIONS

Jovanovic et al., Vernier's Delay Line Time-to-Digital Converter, Computer Science, (2011).

* cited by examiner

PROCESS, VOLTAGE, AND TEMPERATURE INVARIANT TIME-TO-DIGITAL CONVERTER WITH SUB-GATE DELAY RESOLUTION

TECHNOLOGICAL FIELD

Embodiments of the present disclosure relate generally to digital time converters, and more particularly, to digital time converters including production process, supply voltage, and temperature (PVT) invariant delay lines with sub-gate delay resolutions.

BACKGROUND

Many electronic devices utilize simple logical gates to delay electronic signals. The delay of electronic signals may have a variety of purposes, for example, delay lines may be utilized to synchronize electronic signals. In addition, delay lines may be utilized in time-to-digital converters (TDC) to determine or enforce a time difference in the one or more input signals.

A number of issues arise with existing delay line electronic devices. First, delay line devices may be susceptible to variations in production process, voltage, and temperature (PVT). In other words, changes in process, supply voltage, and/or temperature in the electronic device, may produce a variation in a delay produced by the electronic delay line may vary. Second, the resolution of the delay may be limited by the minimum gate delay of the technology utilized to manufacture the logical gates. For example, a complementary metal-oxide-semiconductor (CMOS) gate developed using a 130 nanometer technology may have a minimum gate delay of 200 picoseconds and thus the resolution of any delay may be limited to 200 picosecond increments.

Applicant has identified many technical challenges and difficulties associated with generating PVT invariant delays with sub-gate resolution. Through applied effort, ingenuity, and innovation, Applicant has solved problems related to utilizing electronic components to generate delays by developing solutions embodied in the present disclosure, which are described in detail below.

BRIEF SUMMARY

Various embodiments are directed to an example method, apparatus, and computer program product for generating PVT invariant delays with sub-gate resolution. In accordance with some embodiments of the present disclosure, an example control circuit is provided. In some embodiments, the example control circuit may comprise a first delay circuit (Loop 1) comprising a first plurality of delay elements (N) electrically connected in series, wherein the first delay circuit (Loop 1) is configured to generate a first control voltage (Vctrl1), and wherein the first plurality of delay elements (N) exhibits a first delay time ($\tau 1$) based at least in part on the first control voltage (Vctrl1). The example control circuit may further comprise a second delay circuit (Loop 2) comprising a second plurality of delay elements (N, $M_1$, $M_2$) electrically connected at least in part in series, wherein the second delay circuit (Loop 2) is configured to generate a second control voltage (Vctrl2). In some embodiments, a first group of delay elements (N, $M_1$) of the second plurality of delay elements (N, $M_1$, $M_2$) exhibits the first delay time ($\tau 1$) based at least in part on the first control voltage (Vctrl1), and a second group of delay elements ($M_2$) of the second plurality of delay elements (N, $M_1$, $M_2$) exhibits a second delay time ($\tau 2$) based at least in part on the second control voltage (Vctrl2).

In some embodiments, the control circuit may be structured for receiving a reference clock ($T_{ref}$), wherein the first delay time ($\tau 1$) and the second delay time ($\tau 2$) are based at least in part on the reference clock ($T_{ref}$).

In some embodiments, the reference clock ($T_{ref}$) may be invariant to a variation in process, voltage, and/or temperature.

In some embodiments, the first delay circuit (Loop 1) may further comprise a first phase detector, wherein the first plurality of delay elements (N) generates a first delayed signal, and wherein the first control voltage (Vctrl1) is based at least in part on a phase difference between the first delayed signal and the reference clock ($T_{ref}$).

In some embodiments, the second delay circuit (Loop 2) may further comprise a first tract comprising a first sub-group of delay elements (N), the delay elements of the first sub-group belonging to the first group of delay elements (N, $M_1$), and may further comprise the second group of delay elements ($M_2$), and a second tract.

In some embodiments, the second tract may comprise no delay elements.

In some embodiments, the number of delay elements of the first sub-group of delay elements may be different from the number of delay elements of the first plurality of delay elements.

In some embodiments, the number of delay elements of the first sub-group of delay elements may be equal to the number of delay elements of the first plurality of delay elements.

In some embodiments, the second tract may comprise a second sub-group of delay elements ($M_1$) belonging to the first group of delay elements (N, $M_1$), the first and the second sub-group of delay elements forming the first group of delay elements.

In some embodiments, the second delay circuit (Loop 2) may further comprise a second phase detector structured to receive in input a second delayed signal on the first tract and a further signal on the second tract, wherein the second control voltage may be based at least in part on a phase difference between the second delayed signal and the further signal.

In some embodiments, the example control circuit may further comprise a multiplexer structured to receive in input the first control voltage and the second control voltage and to generate a first command signal based at least in part on the first control voltage and a second command signal based at least in part on the second control voltage.

In some embodiments, the second delay time ($\tau 2$) may be greater than the first delay time ($\tau 1$).

In some embodiments, a difference between the second delay time ($\tau 2$) and the first delay time ($\tau 1$) may be, in absolute value, smaller than each of second delay time ($\tau 2$) and the first delay time ($\tau 1$).

An example electronic circuit is further provided, the example electronic circuit comprising a further delay line comprising a plurality of further delay elements and a plurality of control circuits. In some embodiments, the example control circuit may comprise a first delay circuit (Loop 1) comprising a first plurality of delay elements (N) electrically connected in series, wherein the first delay circuit (Loop 1) is configured to generate a first control voltage (Vctrl1), and wherein the first plurality of delay elements (N) exhibits a first delay time ($\tau 1$) based at least in part on the first control voltage (Vctrl1). The example control circuit may further comprise a second delay circuit (Loop 2) comprising a second plurality of delay elements (N, $M_1$, $M_2$) electrically connected at least in part in series, wherein the second delay circuit (Loop 2) is configured to generate a second control voltage (Vctrl2). In some embodiments, a first group of delay elements (N, $M_1$) of the second plurality of delay elements (N, $M_1$, $M_2$) exhibits the first delay time ($\tau 1$) based at least in part on the first control voltage (Vctrl1), and a second group of delay elements ($M_2$) of the second plurality of delay elements (N, $M_1$, $M_2$) exhibits a second delay time ($\tau 2$) based at least in part on the second control voltage (Vctrl2). In some embodiments, the example control circuit may further comprise a multiplexer structured to receive in input the first control voltage and the second control voltage and to generate a first command signal based at least in part on the first control voltage and a second command signal based at least in part on the second control voltage. In some embodiments, each further delay element may be structured to receive the respective first and second command signal, and each further delay element exhibits the first delay time when receiving the first command signal and exhibits the second delay time when receiving the second command signal.

In some embodiments, a delay resolution may be proportional to a period of the reference clock ($T_{ref}$), and a constant of proportionality between the delay resolution and the reference clock ($T_{ref}$) may be based at least in part on a number of delay elements in the first plurality of delay elements (N), a number of delay elements in the second sub-group of delay elements ($M_1$), and a number of delay elements in the second group of delay elements ($M_2$).

An example method for delaying an electronic signal is also provided. In some embodiments, the method may comprise receiving, at a control circuit, a reference clock. The method may further comprise, generating a first control voltage (Vctrl1) at a first delay circuit (Loop 1) based at least in part on the reference clock, wherein the first delay circuit (Loop 1) comprises a first plurality of delay elements (N) electrically connected at least in part in series, and wherein the first plurality of delay elements (N) exhibits a first delay time ($\tau 1$) based at least in part on the first control voltage (Vctrl1). In some embodiments, the method may further comprise, generating a second control voltage (Vctrl2) at a second delay circuit (Loop 2) based at least in part on the reference clock, wherein the second delay circuit (Loop 2) comprises a second plurality of delay elements (N, $M_1$, $M_2$) electrically connected in series, wherein a first group of delay elements (N, $M_1$) of the second plurality of delay elements (N, $M_1$, $M_2$) exhibits the first delay time ($\tau 1$) based at least in part on the first control voltage (Vctrl1), and wherein a second group of delay elements ($M_2$) of the second plurality of delay elements (N, $M_1$, $M_2$) exhibits a second delay time ($\tau 2$) based at least in part on the second control voltage (Vctrl2). In some embodiments, the example method may further comprise delaying the electronic signal based on the first control voltage and the second control voltage.

In some embodiments, the second delay circuit (Loop 2) may further comprises a first tract comprising a first sub-group of delay elements (N), the delay elements of the first sub-group belonging to the first group of delay elements (N, $M_1$), and further comprising the second group of delay elements ($M_2$). The second delay circuit may further comprise a second tract comprising a second sub-group of delay elements ($M_1$) belonging to the first group of delay elements, the first and the second sub-group of delay elements forming the first group of delay elements.

In some embodiments, the method may further comprise, receiving, at a multiplexer, the first control voltage and the second control voltage and generating a first command signal based at least in part on the first control voltage and a second command signal based at least in part on the second control voltage.

In some embodiments, the method may further comprise receiving, at a further delay line comprising a plurality of further delay elements, the respective first and second command signal at each further delay element, wherein each further delay element exhibits the first delay time when receiving the first command signal and exhibits the second delay time when receiving the second command signal.

An example time-to-digital converter is further provided. In some embodiments, the example time-to-digital converter may comprising a first input signal, a second input signal, an electronic circuit to generate a delayed second input signal based at least in part on the second input signal, and a phase detector configured to determine a signal offset between the first input signal and the delayed second input signal. In some embodiments, the electronic circuit may comprise a further delay line comprising a plurality of further delay elements and a plurality of control circuits. In some embodiments, the example control circuit may comprise a first delay circuit (Loop 1) comprising a first plurality of delay elements (N) electrically connected in series, wherein the first delay circuit (Loop 1) is configured to generate a first control voltage (Vctrl1), and wherein the first plurality of delay elements (N) exhibits a first delay time ($\tau 1$) based at least in part on the first control voltage (Vctrl1). The example control circuit may further comprise a second delay circuit (Loop 2) comprising a second plurality of delay elements (N, $M_1$, $M_2$) electrically connected at least in part in series, wherein the second delay circuit (Loop 2) is configured to generate a second control voltage (Vctrl2). In some embodiments, a first group of delay elements (N, $M_1$) of the second plurality of delay elements (N, $M_1$, $M_2$) exhibits the first delay time ($\tau 1$) based at least in part on the first control voltage (Vctrl1), and a second group of delay elements ($M_2$) of the second plurality of delay elements (N, $M_1$, $M_2$) exhibits a second delay time ($\tau 2$) based at least in part on the second control voltage (Vctrl2). In some embodiments, the example control circuit may further comprise a multiplexer structured to receive in input the first control voltage and the second control voltage and to generate a first command signal based at least in part on the first control voltage and a second command signal based at least in part on the second control voltage. In some embodiments, each further delay element may be structured to receive the respective first and second command signal, and each further delay element exhibits the first delay time when receiving the first command signal and exhibits the second delay time when receiving the second command signal.

BRIEF DESCRIPTION OF THE DRAWINGS

Reference will now be made to the accompanying drawings. The components illustrated in the figures may or may not be present in certain embodiments described herein. Some embodiments may include fewer (or more) components than those shown in the figures in accordance with an example embodiment of the present disclosure.

DETAILED DESCRIPTION

Example embodiments will be described more fully hereinafter with reference to the accompanying drawings, in which some, but not all embodiments of the inventions of the disclosure are shown. Indeed, embodiments of the disclosure may be embodied in many different forms and should not be construed as limited to the embodiments set forth herein; rather, these embodiments are provided so that this disclosure will satisfy applicable legal requirements. Like numbers refer to like elements throughout.

Various example embodiments address technical problems associated with generating a delay signal having sub-gate resolution and invariance to changes in process, voltage, and temperature. As understood by those of skill in the field to which the present disclosure pertains, there are numerous example scenarios in which a user may need to delay a signal with high precision, such that the performance of the delay does not change, requiring reconfiguration or programming, with changes in process, voltage, and temperature.

For example, many electronic devices utilize a series of simple logical delay elements to delay electronic signals. The delay of electronic signals may have a variety of purposes, for example, delay lines may be utilized to synchronize electronic signals, generate electronic pulses having precise pulse widths, create effects in audio applications, introduce phase shifts, filter unwanted frequencies, and many other similar applications. In addition, delay lines may be utilized in a time-to-digital converter (TDC) used to precisely measure the time difference between two events in one or more electronic signals. In some embodiments, the delay elements may be voltage-controlled delay elements. The delays of voltage-controlled delay elements may be changed based on the reception of a control voltage.

A number of issues arise with existing delay line electronic devices. First, delay line devices may be susceptible to variations in production process, voltage, and temperature (PVT). In other words, changes in process, supply voltage, and/or temperature in the electronic device, may produce a variation in a delay produced by the electronic delay line may vary. Second, the resolution of the delay may be limited by the minimum gate delay of the technology utilized to manufacture the logical gates. Resolution refers to the step or change between successive obtainable delays of a delay line. For example, a CMOS gate developed using a 130 nanometer technology may have a minimum gate delay of 200 picoseconds. Thus, in some approaches, only delays that are multiples of 200 picoseconds may be obtained. For example, possible delays may include 1.2 nanoseconds, 1.4, nanoseconds, 1.6 nanoseconds, 1.8 nanoseconds, and so on. However, a delay of 1.3 nanoseconds may be unobtainable. Sub-gate resolution refers to a step or change between successive obtainable delays that is smaller than the minimum gate delay of the specific technology.

One approach has utilized two separate signals, a fast delay, and a slow delay, to realize a delay with sub-gate delay. Utilizing a difference between the fast delay and slow delay may produce a gate delay with a resolution smaller than the gate delay of the associated technology. However, these approaches vary with changes in the production process, supply voltage, and operating temperature of the device. To overcome such variations due to process, voltage, and temperature, in some approaches, variation due to temperature may be recorded an stored in a table, such that the device may be reconfigured based on a measurement of the temperature and/or voltage. Such an approach may be complex, slow, and inaccurate.

The various example embodiments described herein utilize various techniques to obtain sub-gate resolution delays while remaining invariant to changes in temperature and supply voltage. For example, in some embodiments, a first delay circuit comprising a plurality of delay elements and a feedback loop, may generate a first control voltage associated with a particular delay, based on a PVT invariant reference clock. The first control voltage may be transmitted to a second delay circuit. The second delay circuit may include a second plurality of delay elements, including at least a portion of the delay elements for which the delay is controlled by the first control voltage. Additional delay elements may be controlled by a second control voltage based on the feedback voltage of the second delay circuit. The first control voltage of the first delay circuit, associated with a first delay time, and the second control voltage of the second delay circuit, associated with a second delay time may be used to generate PVT invariant sub-gate delays.

As a result of the herein described example embodiments and in some examples, the resolution of delay lines may be greatly improved. In addition, the delay lines described herein may be invariant to changes in process, voltage, and temperature.

Figure 1:
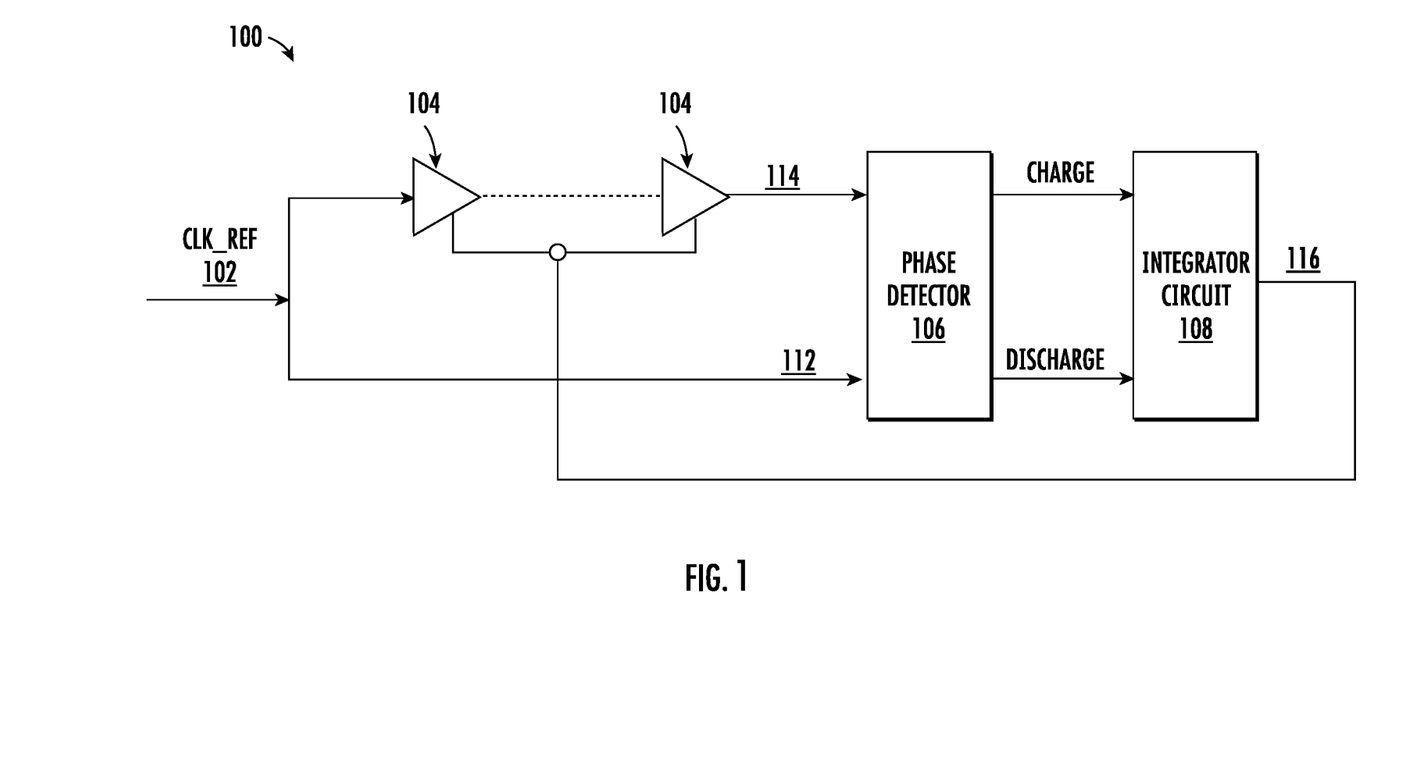
FIG. 1 illustrates a system diagram of an example control circuit configured to generate a control voltage in accordance with one or more embodiments of the present disclosure.

Referring now to FIG. 1, an example control circuit 100 is provided. As depicted in FIG. 1, the example control circuit 100 receives a reference clock 102 and produces two inputs to a phase detector 106, delayed signal 114 and non-delayed signal 112. The reference clock 102 is transmitted directly to the phase detector 106 without any delays, as the non-delayed signal 112. The delayed signal 114 is generated by transmitting the reference clock 102 through a series of voltage-controlled delay elements 104. Thus, the delayed signal 114 arriving at the phase detector 106 is a delayed replica of the non-delayed signal 112. As further depicted in FIG. 1, the output of the phase detector 106 is electrically connected to a integrator circuit 108. The integrator circuit 108 generates a control voltage 116 based on the output of the phase detector 106. The control voltage 116 is fed back as the control voltage to each of the voltage-controlled delay elements 104.

In general, the control circuit 100 of FIG. 1, determines an error between the delayed signal 114 and the non-delayed signal 112 and generates a corrective feedback voltage (e.g., control voltage 116, to the voltage-controlled delay elements 104. Thus, each of the voltage-controlled delay elements 104 receive a control voltage 116 such that the total delay is equivalent to a multiple of the period of the reference clock 102, and each voltage-controlled delay element 104 provides an equivalent fraction of the total delay. As such, the control voltage 116 may be associated with a specific time delay when applied to a similar voltage-controlled delay element 104.

As depicted in FIG. 1, the control circuit 100 receives a reference clock 102 as an input. A reference clock 102 (e.g., $T_{ref}$) may be any electronic signal providing a consistent and stable time base for an electronic device. A reference clock 102 may further be invariant to changes in temperature and supply voltage. Thus, delays determined based on the reference clock 102 may also be invariant to changes in temperature and supply voltage. In some embodiments, a reference clock 102 may be generated by a crystal oscillator or other stable frequency source.

As depicted in FIG. 1, the example control circuit 100 includes a plurality of voltage-controlled delay elements 104. A voltage-controlled delay element 104 may be any electrical component configured to receive an input signal (e.g., reference clock 102) and a control voltage (e.g., control voltage 116), and delay the input signal by a variable amount based at least in part on the control voltage. In some embodiments, a voltage-controlled delay element 104 may comprise a CMOS logic gate, for which the gate delay varies based on the provided control voltage 116. In some embodiments, the higher the control voltage 116 provided to the voltage-controlled delay element 104, the shorter the delay through the gate. In some embodiments, one or more voltage-controlled delay elements 104 may be electrically connected in series to generate a delayed signal 114 based on the reference clock 102.

As further depicted in FIG. 1, the example control circuit 100 includes a phase detector 106. A phase detector 106 may be any electronic device configured to compare the phase of two input signals and output a signal that indicates the difference between the two signals, or two signals one in case of positive shift, "charge", and one in case of negative shift, "discharge." For example, the phase detector 106 may output a charge signal wherein the duration, voltage, and/or current of the signal is proportional to the phase difference of the two input signals. In some embodiments, the phase detector 106 may receive a non-delayed signal 112 and a delayed signal 114 and produce a voltage representing the phase offset between the two signals.

As further depicted in FIG. 1, the example control circuit 100 includes an integrator circuit 108. An integrator circuit 108 may be any electronic device configured to translate the time difference between the input signals into a voltage/current output. For example, a constant current generator charges (or discharges) a capacitor for the time duration of the charge (discharge) input signal. In some embodiments, the integrator circuit 108 may receive the output signal of the phase detector 106 representing the phase difference of the delayed signal 114 and the non-delayed signal 112, and generate a DC control voltage 116. In some embodiments, the integrator circuit 108 may comprise a charge pump.

Figure 2:
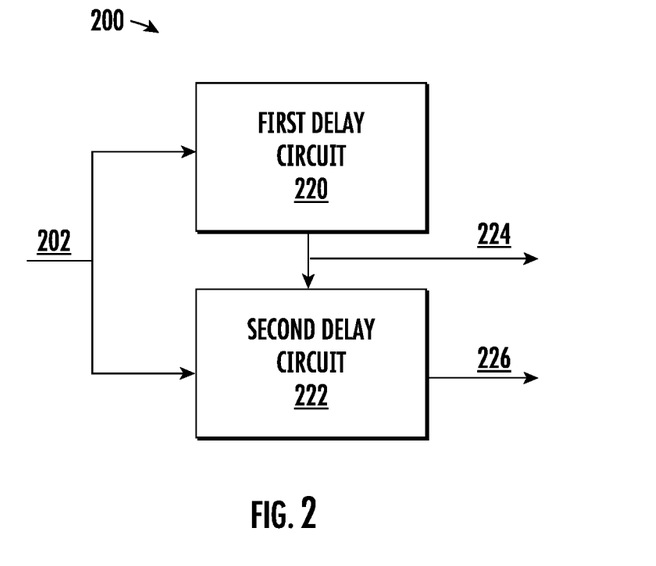
FIG. 2 illustrates a block diagram of an example control circuit configured to generate a first control voltage and a second control voltage in accordance with one or more embodiments of the present disclosure.

Referring now to FIG. 2, an example control circuit 200 configured to produce a PVT invariant sub-gate delay is provided. As depicted in FIG. 2, the example control circuit 200 includes first delay circuit 220 and a second delay circuit 222. The first delay circuit 220 receives a reference clock 202 and produces a first control voltage 224. As further depicted, the second delay circuit 222 receives the reference clock 202 and the first control voltage 224 and produces a second control voltage 226.

As depicted in FIG. 2, the example control circuit 200 incudes a first delay circuit 220 (e.g., Loop 1). The first delay circuit 220 may be any electronic circuit including one or more voltage-controlled delay elements (e.g., voltage-controlled delay element 104) connected in series and configured to produce an output voltage (e.g., first control voltage 224) associated with a time delay (11) of the one or more voltage-controlled delay elements. In some embodiments, the first delay circuit 220 may comprise a delay circuit similar to the control circuit 100 as described in relation to FIG. 1. Further example embodiments of the first delay circuit 220 are described in relation to FIGS. 4-5. In some embodiments, the first control voltage 224 (e.g., Vctrl1) generated by the first delay circuit 220 when applied to a voltage-controlled delay element similar to those comprising the first delay circuit 220, may cause the voltage-controlled delay element to exhibit a similar delay (e.g., 11).

As further depicted in FIG. 2, the example control circuit 200 includes a second delay circuit 222 (e.g., Loop 2). The second delay circuit 222 may be any electronic circuit including one or more voltage-controlled delay elements (e.g., voltage-controlled delay element 104) connected in series, wherein a portion of the delay elements are configured to receive the first control voltage 224 and exhibit a time delay of (11) and a second portion of the delay elements are configured to receive a second control voltage (e.g., second control voltage 226) and exhibit a time delay (12). The second delay circuit 222 is further configured to output the second control voltage 226 (e.g., Vctrl2) associated with the feedback control voltage of the second delay circuit 222. In some embodiments, when the second control voltage 226 is applied to a voltage-controlled delay element similar to those comprising the second delay circuit 222, the voltage-controlled delay element exhibits a similar delay (e.g., 12). Further example embodiments of the first delay circuit 220 are described in relation to FIGS. 4-5.

Figure 3:
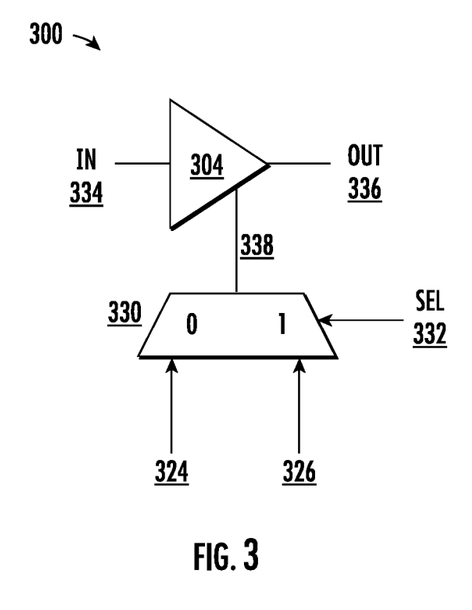
FIG. 3 depicts an example schematic of an example variable delay circuit in accordance with one or more embodiments of the present disclosure.

Referring now to FIG. 3, an example variable delay circuit 300 is provided. As depicted in FIG. 3, the example variable delay circuit 300 includes a control voltage multiplexer 330 configured to receive a first control voltage 324, a second control voltage 326, and a control voltage select signal 332. The control voltage mux 330 is further configured to output a selected control voltage 338. As depicted in FIG. 3, the output of the control voltage multiplexer 330 (selected control voltage 338) is electrically connected to the voltage control input of a delay element 304. The delay element 304 is configured to delay the delay element input 334, based on the selected control voltage 338, to generate the delay element output 336.

As depicted in FIG. 3, the example variable delay circuit 300 includes a control voltage multiplexer 330. A control voltage multiplexer 330 (mux) may be any electronic component configured to receive two signal inputs (e.g., first control voltage 324, second control voltage 326) and output (e.g., selected control voltage 338) one of the provided inputs based on the value of a control signal (e.g., control voltage select signal 332). Although depicted in FIG. 3 as a two-to-one mux, a control voltage multiplexer 330 may receive any number of inputs, for example, a four-to-one mux, eight-to-one mux, or other similar configuration may be utilized. The control voltage mux 330 is configured to select either the first control voltage 324 (e.g., first command signal) or the second control voltage 326 (e.g., second command signal) based on the value of the control voltage select signal 332. For example, in some embodiments, in an instance in which the control voltage select signal 332 is zero, the first control voltage 324 is selected and in an instance in which the control voltage select signal 332 is one, the second control voltage 326 is selected. The selected input may then be transmitted to the output as the selected control voltage 338.

As further depicted in FIG. 3, the example variable delay circuit 300 includes a delay element 304. As further described in relation to FIG. 1, the delay element 304 may be any electrical component configured to receive an input signal (e.g., delay element input 334) and a control voltage (e.g., selected control voltage 338), and delay the input signal by a variable amount based at least in part on the control voltage, to produce a delayed delay element output 336. As described herein, the delay element 304 may exhibit a different delay time based on the selected control voltage 338. Thus, when the control voltage select signal 332 is configured to select the first control voltage 324, the delay element 304 will delay the delay element input 334 by the delay time associated with the first control voltage 324 (e.g., τ1). However, when the control voltage select signal 332 is configured to select the second control voltage 326, the delay element 304 will delay the delay element input 334 by the delay time associated with the second control voltage 326 (e.g., τ2). Thus, the delay of an individual delay element 304 may be changed based on the value of the control voltage select signal 332.

Figure 4:
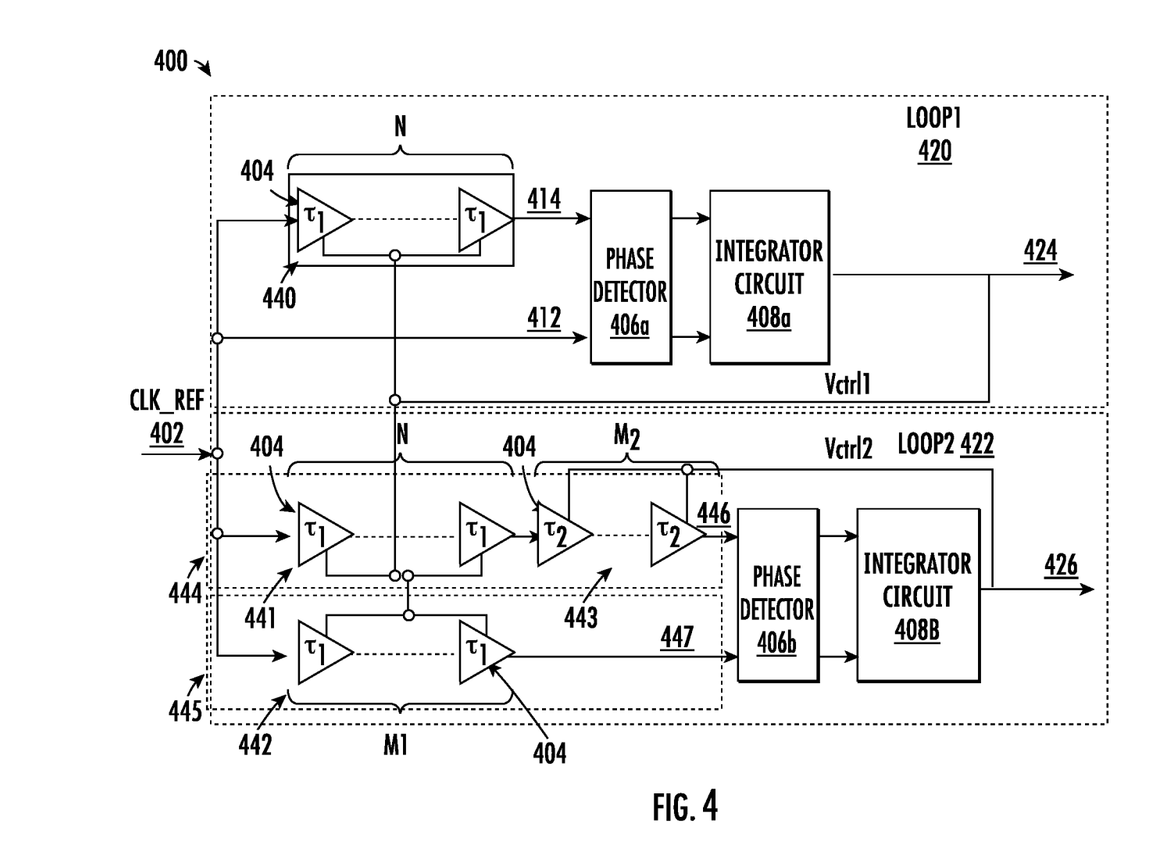
FIG. 4 depicts an example schematic of an example control circuit in accordance with one or more embodiments of the present disclosure.

Referring now to FIG. 4, an example control circuit 400 is provided. As depicted in FIG. 4, the control circuit 400 includes a first delay circuit 420 (Loop 1) and a second delay circuit 422 (Loop 2). The first delay circuit 420 is configured to receive a reference clock 402 and generate a first control voltage 424 based at least in part on the feedback voltage of the first delay circuit 420. The first delay circuit 420 further includes a first phase detector 406a configured to receive a first delayed signal 414 and the reference clock 402. The output of the first phase detector 406a is electrically connected to a first integrator circuit 408a configured to output a first control voltage 424 based at least in part on the phase difference of the first delayed signal 414 and the reference clock 402. As further depicted in FIG. 4, the first delayed signal 414 is generated by transmitting the reference clock 402 through a first plurality of delay elements 440 where each delay element 404 of the plurality of delay elements 440 exhibits a delay time τ1 based on the first control voltage 424.

As further depicted in FIG. 4, the second delay circuit 422 (Loop 2) includes a first tract 444 and a second tract 445. The first tract 444 comprises a first sub-group of delay elements 441 connected in series each configured to receive the first control voltage 424 and exhibit a first delay time τ1. The first sub-group of delay elements 441 is electrically connected in series with a second group of delay elements 443. Each delay element in the second group of delay elements 443 is connected in series, and each is configured to receive the second control voltage 426, exhibiting a second delay time τ2. As depicted, the first tract 444 receives as an input the reference clock 402 and generates a second delayed signal 446 as an input to a second phase detector 406b.

As further depicted in FIG. 4, the second tract 445 includes a second sub-group of delay elements 442 connected in series, each delay element configured to receive the first control voltage 424 and exhibit a first delay time τ1.

As depicted, the second tract 445 receives as an input the reference clock 402 and generates a further signal 447 as a second input to the second phase detector 406b. The output of the second phase detector 406b is electrically connected to a second integrator circuit 408b configured to output a second control voltage 426 based at least in part on the phase difference of the second delayed signal 446 and the further signal 447.

As depicted in FIG. 4, the control circuit 400 comprises a first group of delay elements including all delay elements receiving as a control voltage the first control voltage 424 and exhibiting a first delay time τ1. The delay elements comprising the first group of delay elements includes the first plurality of delay elements 440 of the first delay circuit 420, the first sub-group of delay elements 441 of the first tract 444 of the second delay circuit 422, and the second sub-group of delay elements 442 of the second tract 445 of the second delay circuit 422. In addition, the control circuit 400 comprises a second group of delay elements including all delay elements receiving as a control voltage the second control voltage 426 and exhibiting a second delay time τ2.

As depicted in FIG. 4, the control circuit 400 includes a first delay circuit 420 (Loop 1). The first delay circuit 420 includes a first plurality of delay elements 440 configured to generate the first delayed signal 414. The first plurality of delay elements 440 may comprise any number of one or more delay elements 404 as represented by the number N. The number of delay elements in the first plurality of delay elements 440(N) may alter the first delay time τ1 and associated first control voltage 424. For example, in some embodiments, the first delay time τ1 may be determined by the equation:

$$\tau 1 = \frac{T_{ref}}{N}$$

where $T_{ref}$ is the period of the reference clock 402 and N is the number of delay elements in the first plurality of delay elements 440.

As depicted in FIG. 4, the delay time τ1 is invariant to changes in process, voltage, and temperature (PVT). In other words, τ1 remains stable when subject to variations in production process, changes in supply voltage of the device, and changes in the operating temperature of the components. The delay time τ1 corresponds with the feedback control voltage (e.g., first control voltage 424) of the first delay circuit 420. The first control voltage 424 is determined based on a stable, PVT invariant reference clock 402. The delay time τ1 is also dynamic, meaning it is continually updating. Thus, variations in the performance of electrical components over time are compensated for in the first control voltage 424 based on the PVT invariant reference clock 402 and the delay time τ1 remains constant.

As further depicted in FIG. 4, the control circuit 400 includes a second delay circuit 422. As depicted in FIG. 4, the second delay circuit 422 comprises a second plurality of delay elements comprising the first sub-group of delay elements 441, the second sub-group of delay elements 442 and the second group of delay elements 443. The first tract 444 of a series of delay elements configured to generate the second delayed signal 446, includes a first sub-group of delay elements 441 electrically connected in series with the second group of delay elements 443. The first sub-group of delay elements 441 may comprise any number of one or more delay elements 404 as represented by the number N. In some embodiments, as depicted in FIG. 4, the number of delay elements in the first plurality of delay elements 440(N) may be equal to the number of delay elements in the first sub-group of delay elements 441(N). In some embodiments, the number of delay elements in the first plurality of delay elements 440(N) may be different than the number of delay elements in the first sub-group of delay elements 441(N). As described in relation to FIG. 5, in such an embodiment, the second sub group of delay elements 442 may be unnecessary.

As further depicted in FIG. 4, the first tract 444 of the second delay circuit 422 of the example control circuit 400 further includes a second group of delay elements 443. The second group of delay elements 443 may comprise any number of one or more delay elements 404 as represented by the number $M_2$. Each delay element of the second group of delay elements 443 is electrically connected to the feedback control voltage (e.g., second control voltage 426) of the second delay circuit 422. Thus, each of the delay elements of the second group of delay elements 443 exhibits a second delay time τ2.

As further depicted in FIG. 4, the second delay circuit 422 comprises a second tract 445 of a series of delay elements configured to generate the further signal 447. The second tract 445 includes the second sub-group of delay elements 442 electrically connected in series. Each delay element 404 of the second sub-group of delay elements 442 is electrically connected to the first control voltage 424 of the first delay circuit 420. Thus, each of the delay elements 404 of the second sub-group of delay elements 442 exhibits a first delay time τ1. The second sub-group of delay elements 442 may comprise any number of one or more delay elements 404 as represented by the number $M_1$.

In an instance in which the number of delay elements in the first sub-group of delay elements 441 is equal to the number of delay elements in the first plurality of delay elements 440 (as shown in FIG. 4), the second delay time τ2 associated with the second control voltage 426 may be dependent on the first delay time τ1, as well as, the number of delay elements in the second sub-group of delay elements 442 ($M_1$) and the number of delay elements in the second group of delay elements 443 ($M_2$). Variations in the number of delay elements in each of these groups may alter the second delay time τ2 and the associated second control voltage 426. For example, in some embodiments, the second delay time τ2 may be determined by the equation:

$$\tau 2 = \tau 1 \frac{M_1}{M_2}$$

where τ1 is the delay time associated with the first control voltage 424, $M_1$ is the number of delay elements in the second sub-group of delay elements 442, and $M_2$ is the number of delay elements in the second group of delay elements 443.

As depicted in FIG. 4, the delay time τ2 is invariant to changes in process, voltage, and temperature (PVT) because the second delay circuit 422 produces the feedback voltage (second control voltage 426) based on the reference clock 402, which is PVT invariant. In other words, τ2 remains stable when subject to variations in production process, supply voltage of the device, and operating temperature. The delay time τ2 corresponds with the feedback control voltage (e.g., second control voltage 426) of the second delay circuit 422. The second control voltage 426 is determined based on a stable, PVT invariant reference clock 402. The delay time τ2 is also dynamic, meaning it is continually updating. Thus, variations in the performance of electrical components over time are compensated for in the second control voltage 426 based on the PVT invariant reference clock 402 and the delay time τ2 remains constant.

Figure 5:
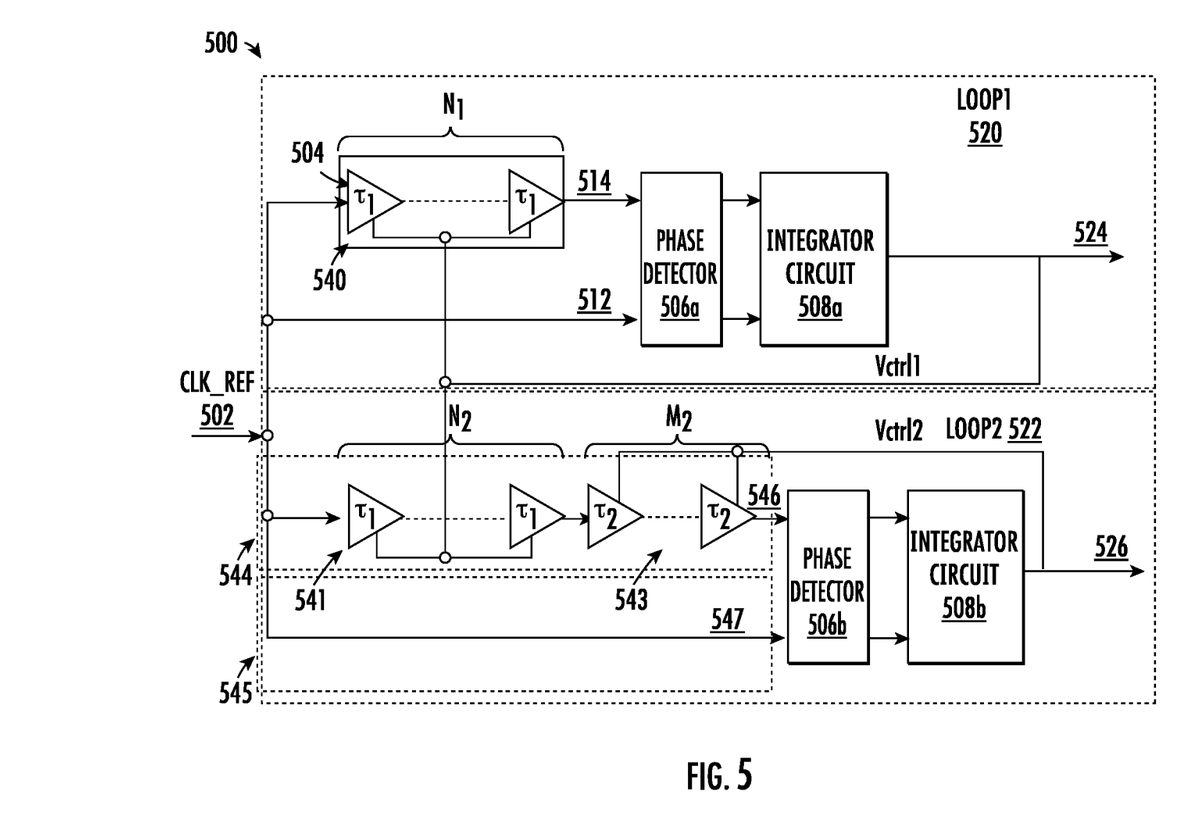
FIG. 5 depicts an example schematic of an example control circuit in accordance with one or more embodiments of the present disclosure.

Referring now to FIG. 5, an example control circuit 500 is provided. As depicted in FIG. 5, the control circuit 500 includes a first delay circuit 520 (Loop 1) and a second delay circuit 522 (Loop 2). The first delay circuit 520 is configured to receive a reference clock 502 and generate a first control voltage 524 based at least in part on the feedback voltage of the first delay circuit 520. The first delay circuit 520 further includes a first phase detector 506a configured to receive a first delayed signal 514 and the reference clock 502. The output of the first phase detector 506a is electrically connected to a first integrator circuit 508a configured to output a first control voltage 524 based at least in part on the phase difference of the first delayed signal 514 and the reference clock 502. As further depicted in FIG. 5, the first delayed signal 514 is generated by transmitting the reference clock 502 through a first plurality of delay elements 540 where each delay element 504 of the plurality of delay elements 540 exhibits a delay time τ1 based on the first control voltage 524.

As further depicted in FIG. 5, the second delay circuit 522 (Loop 2) includes a first tract 544 and a second tract 545. The first tract 544 comprises a first sub-group of delay elements 541 connected in series each configured to receive the first control voltage 524 and exhibit a first delay time τ1. The first sub-group of delay elements 541 is electrically connected in series with a second group of delay elements 543. Each delay element in the second group of delay elements 543 is connected in series, and each is configured to receive the second control voltage 526, exhibiting a second delay time τ2. As depicted, the first tract 544 receives as an input the reference clock 502 and generates a second delayed signal 546 as an input to a second phase detector 506b.

As depicted in FIG. 5, in some embodiments, the number of delay elements in the first plurality of delay elements 540 ($N_1$) may be different from the number of delay elements in the first sub-group of delay elements 541 ($N_2$). In such an embodiment, the second tract 545 no longer comprises any delay elements, and the further signal 547 is generated by transmitting the reference clock 502 directly to the phase detector 506b. Due to the disparate number of delay elements exhibiting the first delay time τ1 on the first tract 544, the delay elements on the second tract 545 are no longer necessary. The second delay time τ2 may now be calculated by the equation:

$$\tau 2 = \tau 1 \frac{N_1 - N_2}{M_2}$$

where τ1 is the delay time associated with the first control voltage 524, $N_1$ is the number of delay elements in the first plurality of delay elements 540, and $N_2$ is the number of delay elements in the first sub-group of delay elements 541, and $M_2$ is the number of delay elements in the second group of delay elements 543.

Figure 6:
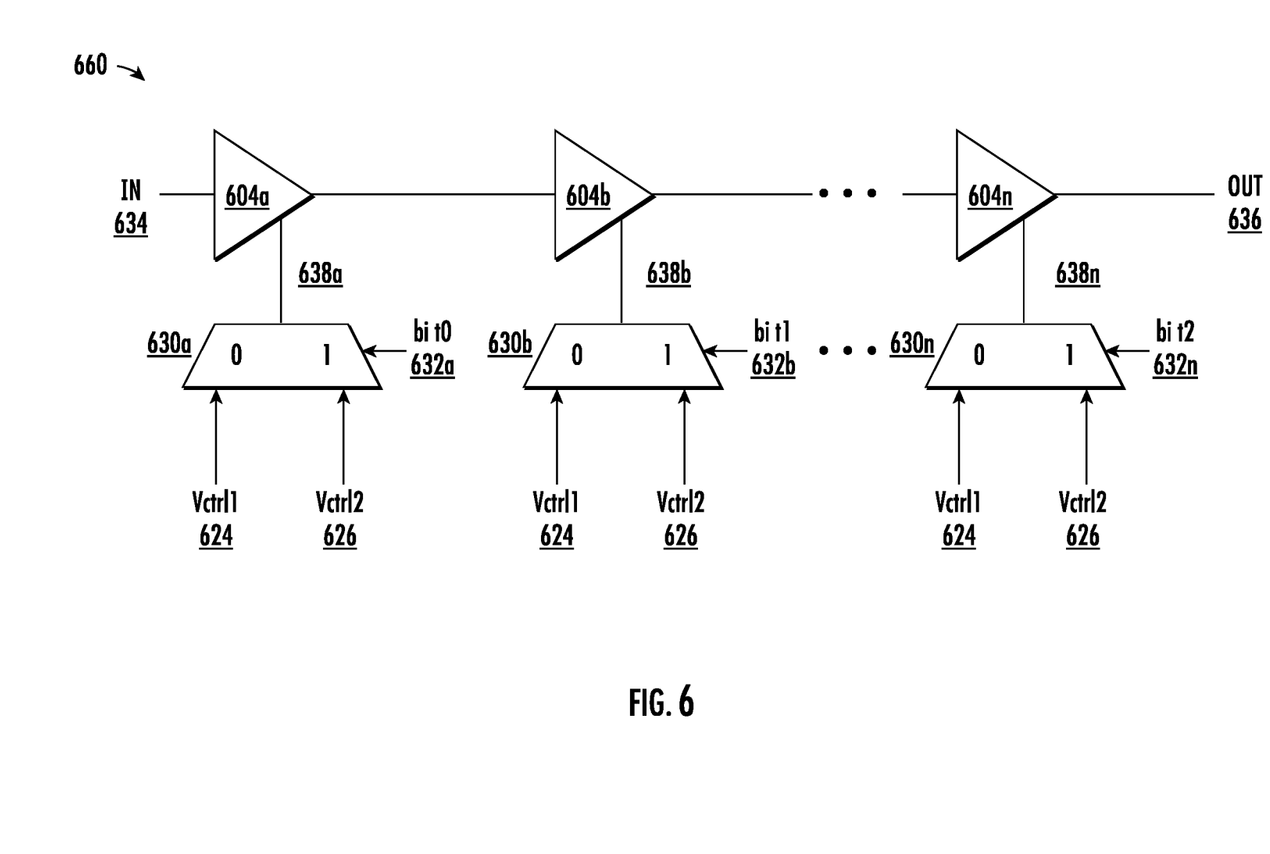
FIG. 6 depicts an example variable delay circuit with sub-gate delay resolution depicts an example schematic of an example control circuit in accordance with one or more embodiments of the present disclosure.

Referring now to FIG. 6, an example PVT invariant variable delay circuit 660 having a sub-gate delay is provided. As depicted in FIG. 6, the example variable delay circuit 660 includes a plurality of control voltage multiplexers 630a-630n (mux) each having two signal inputs, a control input, and a single signal output. Each control voltage mux 630a-630n is configured to receive the first control voltage 624 at one signal input and the second control voltage 626 at the other signal input. In addition, each control voltage mux 630a-630n is configured to receive a control voltage select bit 632a-632n at the control input. As further depicted in FIG. 6, the selected control voltage 638a-638n is transmitted to a corresponding delay element 604a-604n as the control voltage for the delay element 604a-604n. The first delay element 604a receives an input signal 634. The input signal 634 is transmitted through each of the delay elements 604a-604n electrically connected in series. The output of the last delay element 604n is the delayed output signal 636.

As depicted in FIG. 6, the example variable delay circuit 660 includes a plurality of control voltage multiplexers 630a-630n. As described in relation to FIG. 3 (e.g., control voltage multiplexer 330), a control voltage multiplexer 630a-630n may be any electronic component configured to receive two signal inputs (e.g., first control voltage 624, second control voltage 626) and output (e.g., selected control voltage 638a-638n) one of the provided inputs based on the value of a control signal (e.g., control voltage select bit 632a-632n). A variable delay circuit 660 may comprise one or more control voltage multiplexers 630a-630n as required to generate the desired delayed output signal 636. As depicted in FIG. 6, each of the control voltage multiplexers 630a-630n receive the first control voltage 624 (Vctrl1) and the second control voltage 626 (Vctrl2). The first control voltage 624 may be the control voltage output of a first delay circuit (Loop 1), for example, as depicted in FIGS. 4-5, wherein the first control voltage 624 corresponds to a first delay time ($\tau 1$). The second control voltage 626 may be the control voltage output of a second delay circuit (Loop 2), for example, as depicted in FIGS. 4-5, wherein the second control voltage 626 corresponds to a second delay time ($\tau 2$).

As further depicted in FIG. 6, each control voltage multiplexer 630a-630n is configured to receive a control voltage select bit 632a-632n at the control input. As described in relation to FIG. 3 (e.g., control voltage select signal 332), the control voltage select bit 632a-632n may be any signal, group of signals, or series of signals indicating the signal input (e.g., first control voltage 624, second control voltage 626) to output on the signal output (e.g., selected control voltage 638a-638n). For example, as depicted in FIG. 6, in an instance in which the control voltage select bit 632a is low (set to zero), the first control voltage 624 is transmitted on the control voltage mux 630a output as the selected control voltage 638a (e.g., first command signal), and in an instance in which the control voltage select bit 632a is high (set to one), the second control voltage 626 is transmitted on the control voltage mux 630a output as the selected control voltage 638a (e.g., second command signal). In some embodiments, the plurality of control voltage select bits 632a-632n may comprise a digital data signal having multiple bits. For example, in some embodiments, the control voltage select bits may comprise a four bit digital data signal (e.g., 4b'0110). In such an embodiment, a least significant bit may be used as the control voltage select bit at control voltage mux 630a, the second bit may be used as the control voltage select bit at control voltage mux 630b, and so on until the most significant bit may be used as the control voltage select bit at control voltage mux 630n. Thus, the delay of a delayed output signal 636 of a variable delay circuit 660 may be programmed or updated based on the received control voltage select bits 632a-632n.

As further depicted in FIG. 6, the variable delay circuit 660 includes a plurality of delay elements 604a-604n (e.g., further delay elements). A delay element 604a-604n is a voltage-controlled delay device similar to those described in relation to FIG. 1-FIG. 5. As described herein, the delay element 604a-604n may exhibit a different delay time ($\tau 1$, $\tau 2$) based on the control voltage transmitted to the delay element 604a-604n. In other words, in an instance in which the first control voltage 624 is selected by the control voltage mux 630a-630n and transmitted to the control voltage input of the corresponding delay element 604a-604n, the corresponding delay element 604a-604n may delay the input received at the input to the delay element 604a-604n by a certain delay time $\tau 1$. However, in an instance in which the second control voltage 626 is selected by the control voltage mux 630a-630n and transmitted to the control voltage input of the corresponding delay element 604a-604n, the corresponding delay element 604a-604n may delay the input received at the input to the delay element 604a-604n by a certain delay time $\tau 2$, which may be different than $\tau 1$.

Utilizing a plurality of delay elements 604a-604n connected in series (e.g., further delay line), a sub-gate delay resolution may be obtained. As described herein, sub-gate resolution refers to a step or change between successive obtainable delays that is smaller than the minimum gate delay of the specific technology. As depicted in FIG. 6, the delay resolution ($\Delta\tau$) of the variable delay circuit 660 may be defined as:

$$\Delta\tau = \tau_2 - \tau_1.$$

Thus, by carefully selecting the number of delay elements in the first plurality of delay elements (e.g., first plurality of delay elements 440, 540), the number of delay elements in the first sub-group of delay elements (e.g., first sub-group of delay elements 441, 541), the number of delay elements in the second group of delay elements (e.g., second group of delay elements 443, 543), and the number of delay elements in the second sub-group of delay elements (e.g., second sub-group of delay elements 442), a sub-gate delay resolution may be obtained. For example, considering FIG. 4, where the number of delay elements in the first plurality of delay elements is N, the number of delay elements in the first sub-group of delay elements is also N, the number of delay elements in the second group of delay elements is $M_2$, and the number of delay elements in second sub-group of delay elements is $M_1$, the delay resolution of a delay line (e.g., variable delay circuit 300, 660) may be determined by the equation:

$$\Delta\tau = \tau_2 - \tau_1 = T_{ref}\frac{(M_1/M_2 - 1)}{N}.$$

As depicted in FIG. 6, a variable delay circuit 660 receives an input signal 634 at the first delay element 604a, transmits the input signal 634 through each of the electrically connected delay elements 604a-604n and generates a delayed output signal 636 delayed according to each of the programmed delay times ($\tau 1$, $\tau 2$) of each of the delay elements 604a-604n. By adjusting the number of delay elements 604a-604n in the variable delay circuit 660 and adjusting the control voltage select bits 632a-632n of each control voltage mux 630a-630n, a delayed output signal 636 with precise, PVT invariant, sub-gate resolution delay may be generated.

Figure 7:
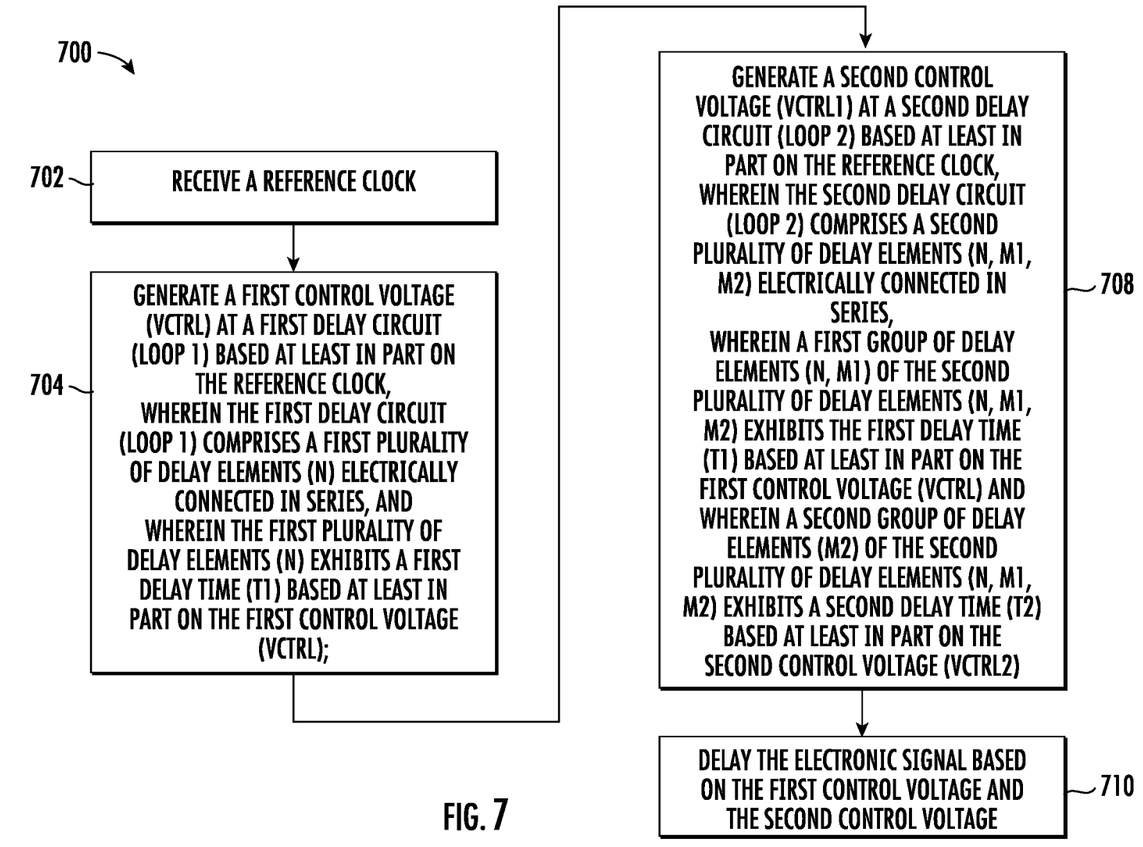
FIG. 7 depicts an example flow chart of a method for generating a process, voltage, and temperature invariant sub-gate delay in accordance with one or more embodiments of the present disclosure.

Referring now to FIG. 7, a flowchart depicting an example process 700 for generating a PVT invariant sub-gate delay is provided. At block 702, an electronic circuit comprising a variable delay circuit (e.g., variable delay circuit 300, 600) and a control circuit (e.g., control circuit 200, 400, 500) receives a reference clock (e.g., reference clock 102, 202, 402, 502). As described herein, a reference clock may be any PVT invariant electronic signal providing a consistent and stable time base for an electronic device.

At block 704, the electronic circuit generates a first control voltage (e.g., first control voltage 224, 324, 424, 524, 624) at a first delay circuit (e.g., first delay circuit 220, 420, 520) based at least in part on the reference clock, wherein the first delay circuit comprises a first plurality of delay elements (e.g., first plurality of delay elements 440, 540) electrically connected in series, and wherein the first plurality of delay elements exhibits a first delay time ($\tau 1$) based at least in part on the first control voltage. As described herein, the control circuit may comprise a first delay circuit or loop utilizing a first control loop to generate a stable first control voltage. The generated first control voltage may be associated with a first delay time ($\tau 1$). Basing the first control voltage at least in part on the reference clock ensures a first delay time ($\tau 1$) that is invariant to changes in process, voltage, temperature, and even the aging of the electronic components.

At block 706, the electronic circuit generates a second control voltage (e.g., second control voltage 226, 326, 426, 526, 626) at a second delay circuit (e.g., second delay circuit 222, 422, 522) based at least in part on the reference clock, wherein the second delay circuit comprises a second plurality of delay elements (e.g., first sub-group of delay elements 441, 541; second group of delay elements 443, 543; second sub-group of delay elements 442) electrically connected in series, wherein a first group of delay elements (first sub-group of delay elements 441, 541; second sub-group of delay elements 442) of the second plurality of delay elements exhibits the first delay time ($\tau 1$) based at least in part on the first control voltage, and wherein a second group of delay elements (e.g., second group of delay elements 443, 543) of the second plurality of delay elements exhibits a second delay time ($\tau 2$) based at least in part on the second control voltage. As described herein, the control circuit may comprise a second delay circuit or loop utilizing a second control loop to generate a stable second control voltage. A portion of the delay elements in the second control loop may receive the first control voltage from the first delay circuit, thus exhibiting a first delay time ($\tau 1$). A second portion of delay elements may receive the second control voltage, thus exhibiting a second delay time ($\tau 2$). Basing the second control voltage at least in part on the reference clock ensures a second delay time ($\tau 2$) that is invariant to changes in process, voltage, temperature, and even the aging of the electronic components.

At block 708, the electronic circuit delays the electronic signal (e.g., delay element input 334, input signal 634) based on the first control voltage and the second control voltage. As described in relation to FIG. 6, an electronic circuit comprising a variable delay circuit 660 configured to receive the first control voltage, the second control voltage, and a control voltage select signal (e.g., control voltage select bits 632a-632n) may be configured to output a delayed output signal 636 having sub-gate delay resolution. For example, in an example embodiment, a variable delay circuit may include two delay elements. Further, suppose the minimum gate delay for a particular logic gate technology is 200 picoseconds, the first delay time $\tau 1$ is 200 picoseconds, and the second delay time $\tau 2$ is 250 picoseconds. The example electronic circuit may be configured to generate delays of 400 picoseconds (e.g., control voltage select bits are 2′b00), 450 picoseconds (e.g., control voltage select bits are 2′b01 or 2′b10), and 500 picoseconds (e.g., control voltage select bits are 2′b11), thus, a sub-gate delay resolution of 50 picoseconds may be realized.

Figure 8:
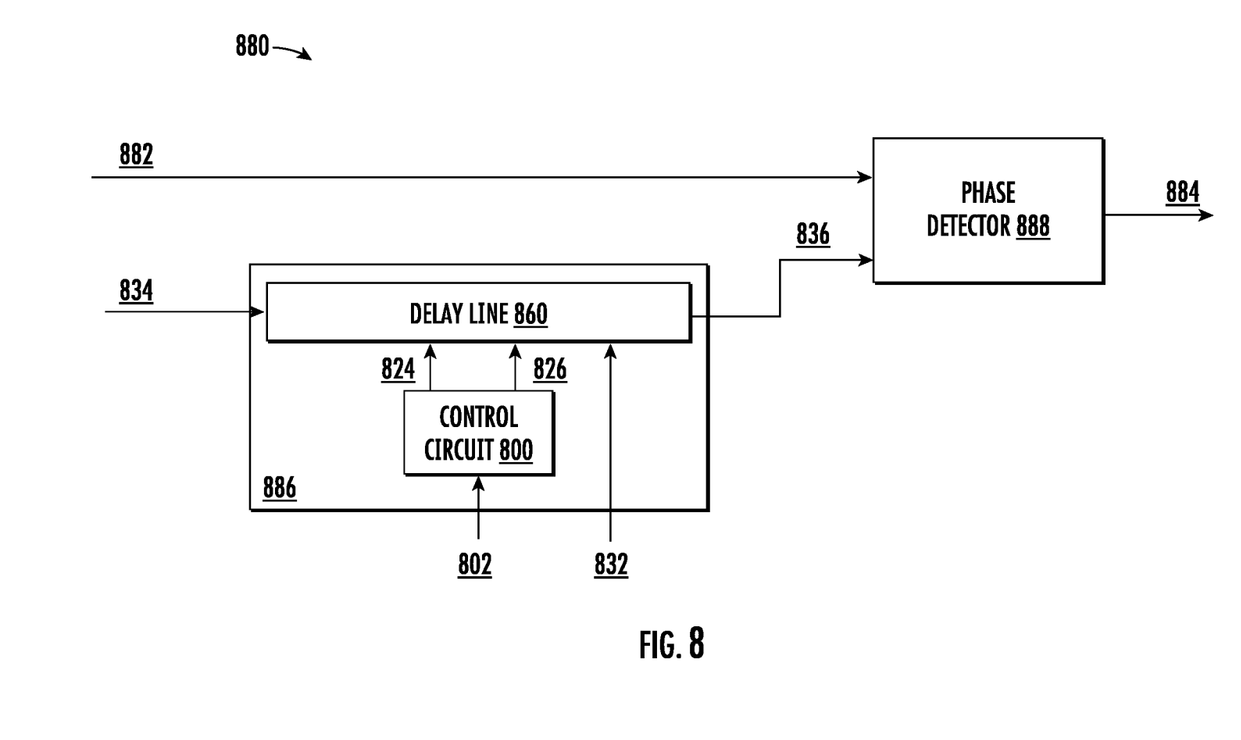
FIG. 8 depicts an example block diagram of an example time-to-digital converter including a process, voltage, and temperature invariant sub-gate delay line in accordance with one or more embodiments of the present disclosure.

Referring now to FIG. 8, an example time-to-digital converter 880 comprising an electronic circuit 886 configured to generate a PVT invariant sub-gate delay is provided. As depicted in FIG. 8, the example time-to-digital converter 880 includes a phase detector 888 configured to generate a signal offset 884 based on the phase difference between a reference signal 882 and a delayed output signal 836. As further depicted in FIG. 8, the example time-to-digital converter 880 further includes an electronic circuit 886 configured to receive an input signal 834 and generate the delayed output signal 836 based on the value of a control voltage select signal 832. The example electronic circuit 886, as depicted, further comprises a control circuit 800 configured to receive a reference clock 802 and generate a first control voltage 824 and a second control voltage 826; and a variable delay circuit 860 configured to generate the delayed output signal based on the received input signal 834 and the first control voltage 824, the second control voltage 826, and the control voltage select signal 832.

As depicted in FIG. 8, a time-to-digital converter 880 (TDC) may be any hardware, firmware, software, or combination thereof configured to receive one or more signals (e.g., reference signal 882, input signal 834) and convert a phase offset between the signals into a digital time. In some embodiments, a signal and a target pulse width may be provided to a TDC in order to determine whether the signal exhibits the desired pulse width. In some embodiments, the digital time and/or signal offset 884 generated by the TDC 880 may be utilized to synchronize the phase of the two input signals.

In general, a TDC 880 may be configured with a precise target delay. For example, the TDC 880 may receive two signals with a desired offset and the desired offset between two signals may be provided via the control voltage select signal 832. In another example, a TDC 880 may receive a signal and a desired pulse width of the signal. In such an example, the signal may be provided to both inputs of the TDC 880 and the desired pulse width may be provided via the control voltage select signal 832. The TDC 880 is configured to transmit the reference signal 882 input to the phase detector 888 with no delay. At the same time, the TDC 880 transmits the input signal 834 to the electronic circuit 886 which may be configured by the control voltage select signal 832 to delay the input signal 834 by the target delay and output the delayed output signal 836. The phase detector 888 may then output the signal offset 884 representing the phase difference between the reference signal 882 and the delayed output signal 836. The signal offset 884 may be monitored by an electronic device, used to adjust one or both of the input signals, or otherwise utilized.

As further depicted in FIG. 8, the electronic circuit 886 receives a reference clock 802 and the control voltage select signal 832. As described further herein, the reference clock 802 enables the electronic circuit to generate PVT invariant time delays. As also described herein, the control voltage select signal 832 enables the electronic circuit 886 to delay the input signal 834 at sub-gate delay resolutions. The control circuit 800, as described herein, generates a first control voltage 824 associated with a first delay time $\tau 1$ and a second control voltage 826 associated with a second delay time $\tau 2$. The variable delay circuit 860 utilizes the first control voltage 824 and the second control voltage 826 to configure the internal delay elements according to the control voltage select signal 832 to generate PVT invariant delays having sub-gate delay resolution.

While this detailed description has set forth some embodiments of the present invention, the appended claims cover other embodiments of the present invention which differ from the described embodiments according to various modifications and improvements. For example, one skilled in the art may recognize that such principles may be applied to any electronic device that requires high resolution delay lines invariant to changes in PVT. For example, time-to-digital controllers, light detection and ranging (LIDAR) systems, oscilloscopes, digital signal processors, audio devices, phase-locked loops, delay-locked loops, and so on.

Within the appended claims, unless the specific term "means for" or "step for" is used within a given claim, it is not intended that the claim be interpreted under 35 U.S.C. 112, paragraph 6.

Use of broader terms such as "comprises," "includes," and "having" should be understood to provide support for narrower terms such as "consisting of," "consisting essentially of," and "comprised substantially of." Use of the terms "optionally," "may," "might," "possibly," and the like with respect to any element of an embodiment means that the element is not required, or alternatively, the element is required, both alternatives being within the scope of the embodiment(s). Also, references to examples are merely provided for illustrative purposes, and are not intended to be exclusive.

The invention claimed is:

1. A control circuit comprising:
   a first delay circuit comprising a first plurality of delay elements electrically connected in series,
      wherein the first delay circuit is configured to generate a first control voltage, and
      wherein the first plurality of delay elements exhibits a first delay time based at least in part on the first control voltage; and
   a second delay circuit comprising a second plurality of delay elements electrically connected at least in part in series,
      wherein the second delay circuit is configured to generate a second control voltage,
      wherein a first group of delay elements of the second plurality of delay elements exhibits the first delay time based at least in part on the first control voltage, and
      wherein a second group of delay elements of the second plurality of delay elements exhibits a second delay time based at least in part on the second control voltage.

2. The control circuit of claim 1, wherein the control circuit is structured for receiving a reference clock, wherein the first delay time and the second delay time are based at least in part on the reference clock.

3. The control circuit of claim 2, wherein the reference clock is invariant to a variation in process, voltage, and/or temperature.

4. The control circuit of claim 2, wherein the first delay circuit further comprises a first phase detector:
   wherein the first plurality of delay elements generates a first delayed signal, and
   wherein the first control voltage is based at least in part on a phase difference between the first delayed signal and the reference clock.

5. The control circuit of claim 2, wherein the second delay circuit further comprises:
   a first tract comprising a first sub-group of delay elements, the delay elements of the first sub-group belonging to the first group of delay elements, and further comprising the second group of delay elements; and
   a second tract.

6. The control circuit of claim 5, wherein the second tract comprises no delay elements.

7. The control circuit of claim 5, wherein the number of delay elements of the first sub-group of delay elements is different from the number of delay elements of the first plurality of delay elements.

8. The control circuit of claim 5, wherein the number of delay elements of the first sub-group of delay elements is equal to the number of delay elements of the first plurality of delay elements.

9. The control circuit of claim 5, wherein the second tract comprises a second sub-group of delay elements belonging to the first group of delay elements, the first and the second sub-group of delay elements forming the first group of delay elements.

10. The control circuit of claim 5, wherein the second delay circuit further comprises a second phase detector structured to receive in input a second delayed signal on the first tract and a further signal on the second tract, wherein the second control voltage is based at least in part on a phase difference between the second delayed signal and the further signal.

11. The control circuit of claim 1, further comprising a multiplexer structured to receive in input the first control voltage and the second control voltage and to generate a first command signal based at least in part on the first control voltage and a second command signal based at least in part on the second control voltage.

12. An electronic circuit comprising:
   a further delay line comprising a plurality of further delay elements; and
   a plurality of control circuits according to claim 11, each control circuit being connected to a respective further delay element,
   wherein each further delay element is structured to receive the respective first and second command signal, and
   wherein each further delay element exhibits the first delay time when receiving the first command signal and exhibits the second delay time when receiving the second command signal.

13. The electronic circuit of claim 12, wherein a delay resolution is proportional to a period of the reference clock, and a constant of proportionality between the delay resolution and the reference clock is based at least in part on a number of delay elements in the first plurality of delay elements, a number of delay elements in the second sub-group of delay elements, and a number of delay elements in the second group of delay elements.

14. A time-to-digital converter comprising:
   a first input signal;
   a second input signal;
   an electronic circuit according to claim 12 configured to generate a delayed second input signal based at least in part on the second input signal; and
   a phase detector configured to determine a signal offset between the first input signal and the delayed second input signal.

15. The control circuit of claim 1, wherein the second delay time is greater than the first delay time.

16. The control circuit of claim 1, wherein a difference between the second delay time and the first delay time is, in absolute value, smaller than each of second delay time and the first delay time.

17. A method for delaying an electronic signal, the method comprising:
   receiving, at a control circuit, a reference clock;
   generating a first control voltage at a first delay circuit based at least in part on the reference clock,
      wherein the first delay circuit comprises a first plurality of delay elements electrically connected at least in part in series, and
      wherein the first plurality of delay elements exhibits a first delay time based at least in part on the first control voltage;
   generating a second control voltage at a second delay circuit based at least in part on the reference clock,
      wherein the second delay circuit comprises a second plurality of delay elements electrically connected in series,
      wherein a first group of delay elements of the second plurality of delay elements exhibits the first delay time based at least in part on the first control voltage, and
      wherein a second group of delay elements of the second plurality of delay elements exhibits a second delay time based at least in part on the second control voltage; and
   delaying the electronic signal based on the first control voltage and the second control voltage.

18. The method of claim 17, wherein the second delay circuit further comprises:
   a first tract comprising a first sub-group of delay elements, the delay elements of the first sub-group belonging to the first group of delay elements, and further comprising the second group of delay elements; and
   a second tract comprising a second sub-group of delay elements belonging to the first group of delay elements, the first and the second sub-group of delay elements forming the first group of delay elements.

19. The method of claim 18, further comprising:
   receiving, at a multiplexer, the first control voltage and the second control voltage; and
   generating a first command signal based at least in part on the first control voltage and a second command signal based at least in part on the second control voltage.

20. The method of claim 19, further comprising:
   receiving, at a further delay line comprising a plurality of further delay elements, the respective first and second command signal at each further delay element,
      wherein each further delay element exhibits the first delay time when receiving the first command signal and exhibits the second delay time when receiving the second command signal.

\* \* \* \* \*